United States Patent [19]
Yokota et al.

[11] Patent Number: 5,104,455
[45] Date of Patent: Apr. 14, 1992

[54] AMORPHOUS SEMICONDUCTOR SOLAR CELL

[75] Inventors: Akitoshi Yokota; Yukihiko Nakata, both of Nara; Hitoshi Sannomiya, Osaka; Sota Moriuchi, Nara; Yasumi Inoue, Osaka; Manabu Itoh, Nara, all of Japan

[73] Assignee: Sharp Kabushiki Kaisha, Osaka, Japan

[21] Appl. No.: 638,571

[22] Filed: Jan. 7, 1991

[30] Foreign Application Priority Data

Jan. 9, 1990 [JP] Japan ............................ 2-3193
Feb. 28, 1990 [JP] Japan ............................ 2-50402

[51] Int. Cl.$^5$ ............... H01L 31/065; H01L 31/0376
[52] U.S. Cl. ................... 136/249; 136/255; 136/258; 357/30
[58] Field of Search .......... 136/249 TJ, 255, 258 AM; 357/30 J, 30 K

[56] References Cited

U.S. PATENT DOCUMENTS 4,816,082 3/1989 Guha et al. ............... 136/249

FOREIGN PATENT DOCUMENTS

3119631A1 11/1983 Fed. Rep. of Germany ...... 136/258 AM
58-98988 6/1983 Japan ............... 136/255

*Primary Examiner*—Aaron Weisstuch

[57] ABSTRACT

An amorphous semiconductor solar cell includes an i type layer which is an at least partially alloyed, substantially intrinsic semiconductor, an n type layer formed on one side of the i type layer, and a p type layer formed n the other side of the i type layer, and the i type layer has its energy bandgap varied in a thickness direction to have a bandgap larger than the bandgap of the p type layer in the vicinity of the interface with the p type layer.

9 Claims, 7 Drawing Sheets 5,104,455

AMORPHOUS SEMICONDUCTOR SOLAR CELL

BACKGROUND OF THE INVENTION

1. Field of the Invention

The present invention relates to amorphous semiconductor solar cells having p-i-n junctions, and more particularly to improvements of the photoelectric conversion efficiency thereof.

2. Description of the Background Art

Amorphous semiconductor solar cell has larger light absorbance, so that it has a large number of advantages such as a thin semiconductor layer, a simple manufacturing process, and a smaller energy requirement for manufacturing because of a low manufacturing temperature. In order to have satisfactory characteristics as a solar power cell, however, it still has some other problems to be solved such as further improvements in the photoelectric conversion efficiency and prevention of optical degradation (degradation of the photoelectric conversion efficiency due to light irradiation over a long time).

Accordingly, in view of the goal of obtaining improvements in the photoelectric conversion efficiency, an a-Si alloy solar cell using an a-Si alloy instead of amorphous silicon (a-Si) as an intrinsic (i type) semiconductor layer has been considered.

Referring to FIG. 1, one example of such an a-Si alloy solar cell according to the prior art is shown. On a conductive substrate 1, an n layer 2 of a-Si, an i layer 3 of amorphous silicon carbon (a-SiC) alloy, for example, and a p layer 4 of a-Si are sequentially provided. A transparent conductive film 5 is formed on the p layer 4. Since the a-SiC alloy i layer 3 has an energy bandgap larger than that of intrinsic a-Si, it can effectively photoelectrically convert light of short wave length to obtain a high open-circuit voltage $V_{oc}$.

Referring to FIG. 2, curve 2A indicating the photoelectric conversion characteristics of a solar cell including an i layer of a-SiC alloy and curve 2B indicating the photoelectric conversion characteristics of a solar cell including an i layer of a-Si are shown for comparison. In this graph, the horizontal axis indicates open-circuit voltage $V_{oc}$ (V), and the vertical axis indicates short-circuit current Isc (mA/cm$^2$). As seen from curves 2A and 2B, as compared to an a-Si solar cell, although the a-SiC alloy solar cell has an increased open-circuit voltage $V_{oc}$ because of effective use of short wave length light, it has a decreased short-circuit current Isc and decreased fill factor FF (obtained by dividing the maximum output by a product of the open-circuit voltage and the short-circuit current). That is, as a result, it can be seen that the a-SiC alloy solar cell does not have a photoelectric conversion efficiency significantly improved as compared to the a-Si solar cell.

On the other hand, if amorphous silicon germanium (a-SiGe) alloy is employed as the i layer 3 in the a-Si alloy solar cell of FIG. 1, since a-SiGe has a smaller bandgap as compared to a-Si, long wave length light can be effectively employed for photoelectric conversion. If p layer 4 is formed of a-SiC having a large bandgap in order to prevent optical absorption therein, a discontinuity of the bandgap is produced at the i-p interface. The discontinuity of the bandgap increases recombination of carriers at the i-p interface to reduce the open-circuit voltage $V_{oc}$ and the fill factor FF. Therefore in order to prevent the decrease of the open-circuit voltage $V_{oc}$ and the fill factor FF, as shown by the band structure in FIG. 3, it has been proposed to eliminate the discontinuity of the bandgap at the i-p interface by tapering the bandgap width of the i layer 3 in the vicinity of the i-p interface (see U.S. Pat. No. 4,816,32).

The film quality of an i layer of an a-Si alloy is, however, generally inferior to that of a-Si. Accordingly, in a solar cell with the entire thickness of the i-layer 3 formed of an a-Si alloy, the fill factor FF is reduced. Therefore, as shown in the bandgap structure of FIG. 4, it has been proposed to partially bring the film quality of i layer 3 close to the good film quality of the a-Si by varying the composition ratio of the alloy of the i layer 3 to vary the bandgap. That is, it has been proposed to improve the fill factor FF while maintaining the characteristics of the a-Si alloy material such as high sensitivity with respect to long wave length light and a decrease in voltage factor loss (see U.S. Pat. No. 4,816,082). In this case, it is reported that an internal electric field is produced by continuously varying the bandgap of the i layer to implement a gradient, which facilitates movement of carriers.

Furthermore, a development project of tandem type solar cells in which a plurality of solar cells employing a-Si alloy materials are stacked up as solar cells capable of implementing high efficiency is in progress.

As described above, although solar cells employing a-alloy materials have been improved recently, further improvements of photoelectric conversion efficiency for obtaining solar cells with higher efficiency are still required.

SUMMARY OF THE INVENTION

It is an object of the present invention to provide an a-Si solar cell with further improved photoelectric conversion efficiency.

An amorphous semiconductor solar cell according to the present invention includes an i type layer which is made of an at least partly alloyed, substantially intrinsic semiconductor, an n type layer formed on one side of the i type layer, and a p type layer formed on the other side of the i type layer, wherein the energy bandgap of the i type layer varies in the thickness direction such that it is larger than the bandgap of the p type layer in the vicinity of the interface with the p type layer.

The foregoing and other object, features, aspects and advantages of the present invention will become more apparent from the following detailed description of the present invention when taken in conjunction with the accompanying drawings.

DESCRIPTION OF THE PREFERRED EMBODIMENTS

Figure 5:
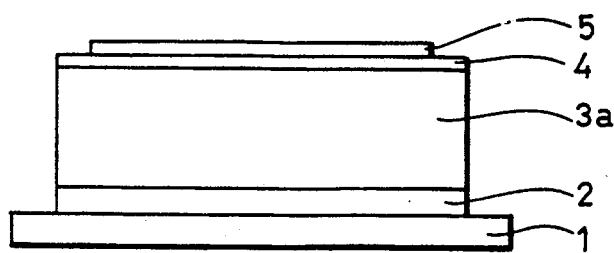
FIG. 5 is a schematic cross sectional view showing the structure of an amorphous semiconductor solar cell according to the first embodiment of the present invention.

Referring to FIG. 5, an amorphous semiconductor solar cell according to the first embodiment of the present invention is shown. On a conductive substrate 1, an n layer 2 of a-Si, an i layer 3a including at least a sublayer of an a-Si alloy, and a p layer 4 of a-SiC are sequentially stacked. A transparent conductive film 5 is formed on the p layer 4.

A stainless steel plate with a thickness of 0.2 mm can be employed as conductive substrate 1. The n layer 2 of a-Si can be deposited having a film thickness of about 1000 Å by the glow discharge method employing silane gas as a raw material gas diluted with hydrogen gas and also phosphine gas as a dopant gas. The i layer 3a, for example, can be deposited having a thickness of about 3000 Å while changing the flow rates of $GeH_4$ gas and $CH_4$ gas with respect to the flow rate of $SiH_4$ gas depending on the film thickness of i layer 3a.

Figure 6:
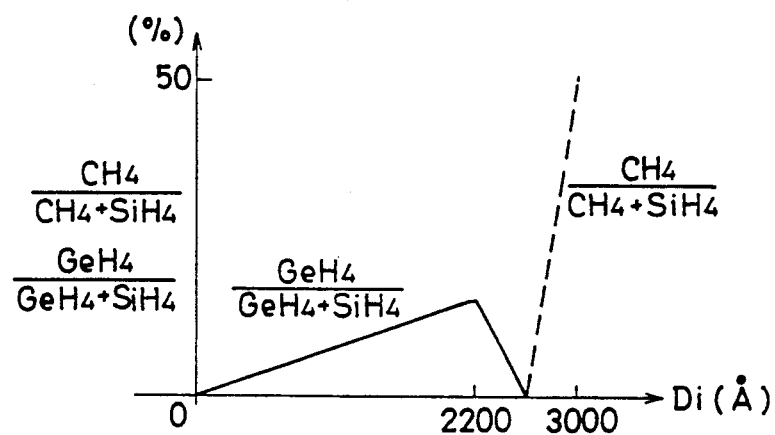
FIG. 6 is a graph showing changes of the gas flow ratio in the CVD (Chemical Vapor Deposition) of an i layer of the first embodiment.

Referring to FIG. 6, one example of changes of flow ratio of the $GeH_4$ gas and the $CH_4$ gas with respect to the $SiH_4$ gas is shown. In the figure, the horizontal axis indicates the thickness Di (Å) of i layer 3a being deposited on the n layer, and the vertical axis indicates the gas flow ratio $GeH_4/(GeH_4+SiH_4)$ and $CH_4/(CH_4+SiH_4)$ expressed as a percentage. That is, the flow ratio $GeH_4/(GeH_4+SiH_4)$ is gradually increased from 0% at the n-i interface to 15% a thickness of the i layer 3a of 2200 Å. Next, the flow ratio $GeH_4/(GeH_4+SiH_4)$ is gradually decreased from 15% at a thickness of the i layer 3a of 2200 Å to 0% at a thickness of 2600Å. Subsequently, $CH_4$ gas is introduced instead of the $GeH_4$ gas, and the flow ratio $CH_4/(CH_4+SiH_4)$ is gradually increased from 0% at a thickness of the i layer 3a of 2600 Å to 50% at a thickness of 3000 Å.

The p layer 4 of a-SiC can be deposited having a thickness of about 100-150 Å by the glow discharge method employing $SiH_4$ gas, $CH_4$ gas and $B_2H_6$ gas diluted with hydrogen as a raw material gas. Furthermore, transparent conductive layer 5 on p layer 4 can be formed by depositing a transparent conductive substance such as indium tin oxide to a thickness of about 700 Å by an electron beam deposition method or a sputtering method, for example.

Figure 7:
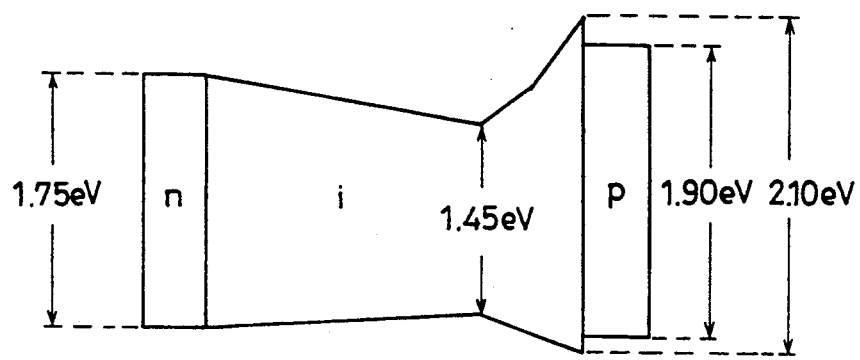
FIG. 7 is a diagram of the energy band structure of a solar cell according to the first embodiment.

Referring to FIG. 7, the energy band structure of a solar cell formed according to the above-described first embodiment is shown. The i layer 3a has a bandgap of 1.75eV which is the same as that of n layer 2 of a-Si at the n-i interface. The bandgap of i layer 3a, however, gradually decreases from 1.75eV at the n-i interface to 1.45eV at a thickness of the i layer 3a of 2200Å. Subsequently, it gradually increases to 2.10eV at a thickness of 3000 Å. On the other hand, the bandgap of p layer 4 of a-SiC is set at 1.90eV.

Figure 4:
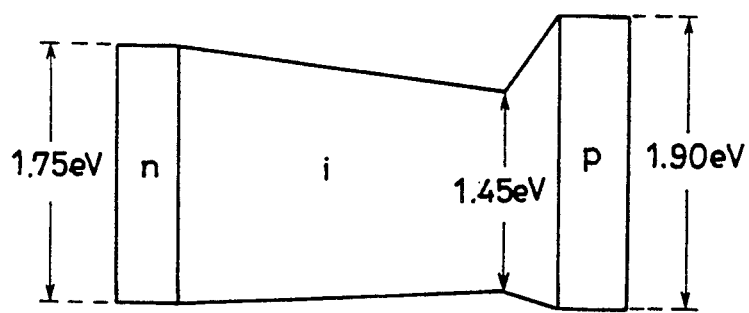
Figure 8:
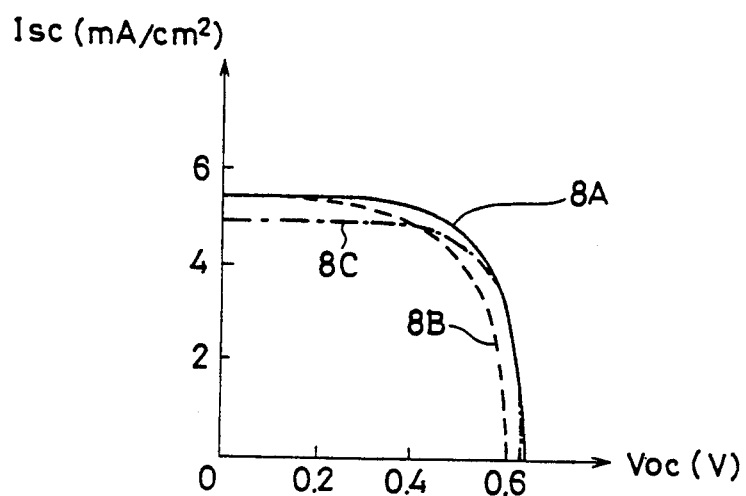
FIG. 8 is a graph showing the voltage-current characteristics of an amorphous semiconductor solar cell according to the present invention.

Referring to FIG. 8, the voltage-current characteristic of a solar cell according to the first embodiment is shown compared to a prior art solar cell. In this graph, the horizontal axis indicates open-circuit voltage $V_{oc}$ (V), and the vertical axis indicates short-circuit current $I_{sc}$ (mA/cm$^2$). The solid curve 8A indicates the voltage-current characteristic of the solar cell of the first embodiment, and the broken line curve 8B indicates the voltage-current characteristic of the prior art solar cell shown in FIG. 4. The i layer 3 of the solar cell of FIG. 4 is formed with a flow ratio $CH_4/(CH_4+SiH_4)=25\%$ at the i-p interface, and the i layer 3 has a bandgap of 1.90 eV, the same as that of p layer 4 at the i-p interface. In measuring the voltage-current characteristics, an AMI spectrum of 100mW/cm$^2$ (the spectrum of solar light on the equator) is employed as a light source, and light of long wavelength no less than 660nm selected by a filter was directed toward the solar cell.

Referring to Table I, characteristic values of the solar cells corresponding to the curves 8A and 8B in FIG. 8 are listed.

TABLE I

| | Short-Circuit Current (mA/cm$^2$) | Open-Circuit Voltage (V) | Fill Factor | Maximum Output Power (mW/cm$^2$) |
|---|---|---|---|---|
| Prior Art | 5.4 | 0.61 | 0.56 | 1.84 |
| First Embodiment | 5.4 | 0.63 | 0.61 | 2.08 |
| Second Embodiment | 5.0 | 0.63 | 0.63 | 1.98 |

As seen from Table I, in the solar cell of the first embodiment, both the open-circuit voltage $V_{oc}$ and the fill factor FF are improved as compared to the prior art solar cell, and the maximum output is improved by about 13%. It appears that the are improved because the bandgap of i layer 3a is larger than the bandgap of p layer 4 at the i-p interface in the solar cell of the first embodiment, so that reverse direction diffusion of electrons into p layer 4 is restrained, thereby reducing recombination of carriers at the i-p interface and in p layer 4.

The solar cell of FIG. 4, according to the prior art, is intended to reduce recombination of carriers through the interface energy level due to discontinuity of the bandgap at the i-p interface and also not to prevent movement of carriers because of the discontinuity of the bandgap. The present inventors, however, have discovered that the recombination of carriers through the interface energy level is not increased even if the bandgap of i layer 3a at the i-p interface is made larger that of p layer 4, and that the reverse direction diffusion of carriers is restrained because of an increase of an internal electric field. That is to say, separation of different kinds of carriers and movement of the carriers to corresponding electrodes are facilitated by a strong internal electric field due to a gradient of the bandgap in i layer 3a to improve the fill factor FF.

Figure 9:
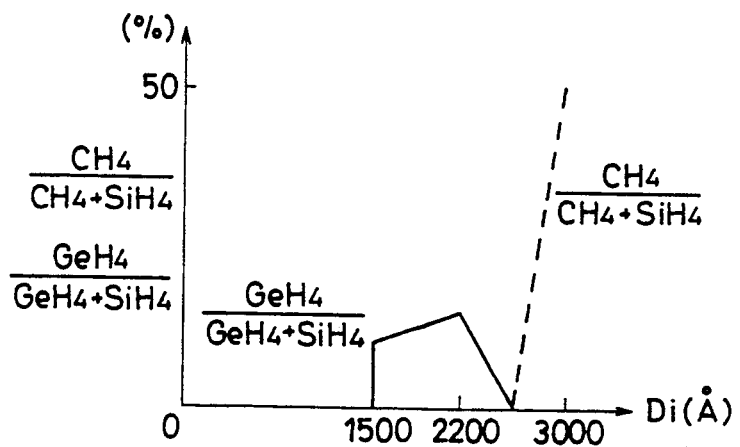
FIG. 9 is a graph showing changes of the gas flow ratio in the CVD of i layer according to the second embodiment.
Figure 10:
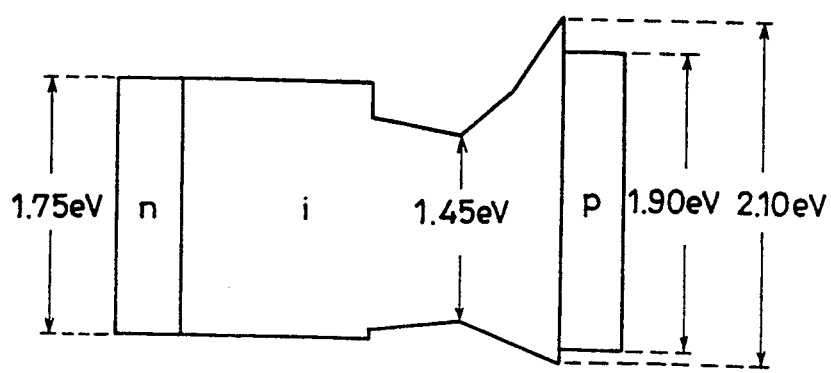
FIG. 10 is a diagram of the energy band structure of a solar cell according to the second embodiment.

Referring to FIGS. 9 and 10, a solar cell according to the second embodiment of the present invention will be described. The solar cell of the second embodiment has a structure similar to that of the solar cell of FIG. 5, but the band structure of i layer 3a is modified.

That is, as shown in FIG. 9, when forming i layer 3a in the second embodiment, the flow ratio $GeH_4/(GeH_4+SiH_4)$ is made 0% from the n-i interface to a thickness of i layer 3a of 1500 Å. In other words, i layer 3a is formed of a-Si from the n-i interface to a thickness of 1500Å. The flow ratio of $GeH_4/(GeH_4+SiH_4)$, is however, made 10% at a thickness of the i layer 3a of 1500 Å, and is gradually increased to 15% at a thickness of 2200 Å. Next, the flow ratio $GeH_4/(GeH_4+SiH_4)$ is gradually decreased from 15% at the thickness of the i layer 3a of 2200 Å to 0% at 2600 Å thickness. Subsequently, $CH_4$ gas is introduced in place of $GeH_4$ gas, and the flow ratio $CH_4/(CH_4+SiH_4)$ is gradually increased from 0% at the i layer 3a thickness of 2600 Å to 50% at 3000Å thickness.

FIG. 10 shows the band structure in a solar cell formed according to the gas flow rate control of FIG. 9. The band structure of FIG. 10 is similar to that in FIG. 7, but the i layer 3a has a band gap of 1.75eV like the n layer of a-Si between the n-i interface and the thickness of 1500 Å in FIG. 10. In other words, the i layer 3a in the second embodiment is formed of a-Si between the n-i interface and the thickness of 1500 Å, and has good film quality.

The photoelectric conversion characteristics of the solar cell according to the second embodiment are shown by the chain line curve 8C in FIG. 8, and also listed in Table I. As seen from Table I, in the solar cell according to the second embodiment, the short-circuit current $I_{sc}$ is reduced as compared to the prior solar cell of FIG. 4, but the open-circuit voltage $V_{oc}$ and the fill factor FF are improved, with the result that the maximum output is improved by about 8%. That is, the characteristics of the solar cell are not degraded even if the bandgap in i layer 3a varies in a step-wise manner. On the contrary, since the i layer 3a includes a sublayer of a-Si with good film characteristics, the fill factor FF is further improved.

Figure 11:
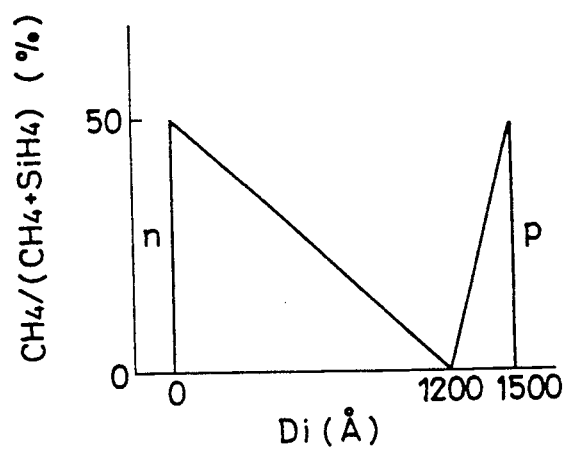
FIG. 11 is a graph showing the relationship between the thickness of the i layer in a solar cell according to the third embodiment and the gas flow ratio.
Figure 12:
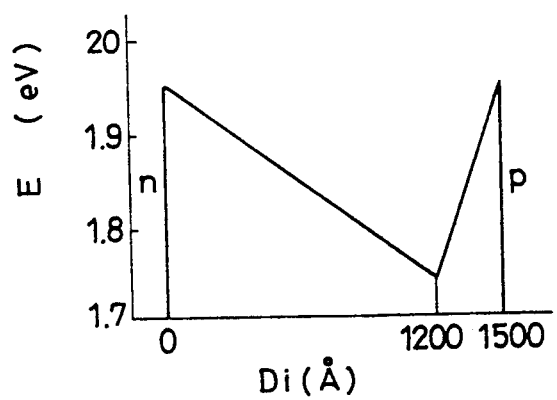
FIG. 12 is a graph showing changes of the bandgap in the thickness direction of the i layer of the solar cell according to the third embodiment.

Referring to FIGS. 11 and 12, a solar cell according to the third embodiment of the present invention will be described. Although the solar cell of the third embodiment has a structure similar to that of the solar cell of FIG. 5, its i layer 3a has a thickness of 1500 Å and the band structure is modified. This i layer 3a is formed of a-SiC alloy in order to effectively utilize light of short wave length, especially.

That is to say, as shown in FIG. 11, when forming the i layer a in the third embodiment, the flow ratio $CH_4/(CH_4+SiH_4)$ is gradually decreased from 50% at the n-i interface to 0% at an i layer 3a thickness of 1200 Å. Subsequently, the flow ratio $CH_4/CH_4+SiH_4)$ is gradually increased from 0% at the i layer 3a thickness of 1200 Å to 50% at 1500 Å thickness. Such flow rate control can be performed by varying the flow rate of $CH_4$ gas in a range of 5.0 cc/sec–0.0 cc/sec with the flow rate of the $SiH_4$ gas constantly maintained at 5.0 cc/sec, for example.

Referring to FIG. 12, the change of the energy bandgap in the i layer 3a formed with the gas flow ratio varied as shown in FIG. 11 is shown. The horizontal axis indicates the thickness Di (Å) of i layer 3a and the vertical axis indicates bandgap E (eV). As seen from FIGS. 11 and 12, at the n-i interface and the i-p interface where the gas flow ratio $CH_4/(CH_4+SiH_4)$ was 50%, the i layer 3a has a large energy bandgap of E=1.95 eV, but the bandgap E decreases in proportion to the decrease of these flow ratio $CH_4/(CH_4+SiH_4)$. It is also seen that the bandgap has a minimum value of E=1.75eV corresponding to the position 1200 Å distant from the n-i interface where the gas flow ratio $CH_4/(CH_4+SiH_4)$ was 0%.

Such a region with a small bandgap E in i layer 3a is preferably provided in the vicinity of the i-p interface rather than in the vicinity of the n-i interface. This is because light absorption is larger in such a region with small bandgap E and the distance the holes produced there need to move to p layer 4 is short, so that the collecting efficiency with respect to the holes is increased. As a result, with the open-circuit voltage $V_{oc}$ maintained high, the short-circuit current $I_{sc}$ and the fill factor FF can be improved to increase the photoelectric conversion efficiency. Here, electrons produced in a region with small bandgap E have to move a relatively long distance to the n layer 2, but it is not a problem at al as the mobility of electrons is originally large.

Figure 1:
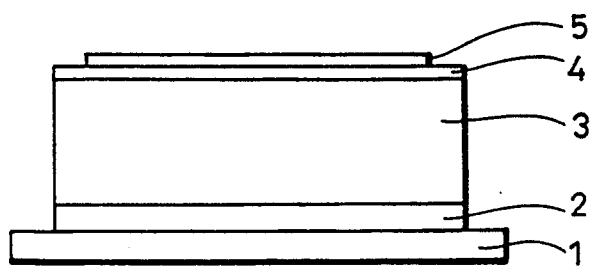
FIG. 1 is a schematic cross sectional view showing the structure of an amorphous semiconductor solar cell according to the prior art.
Figure 2:
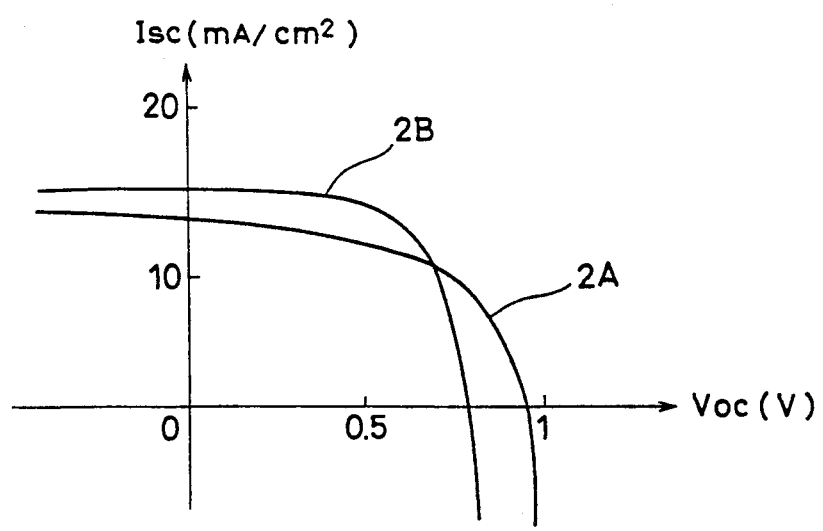
FIG. 2 is a graph for comparing the photoelectric conversion characteristics of an a-SiC alloy solar cell according to prior art and an a-Si solar cell.
Figure 3:
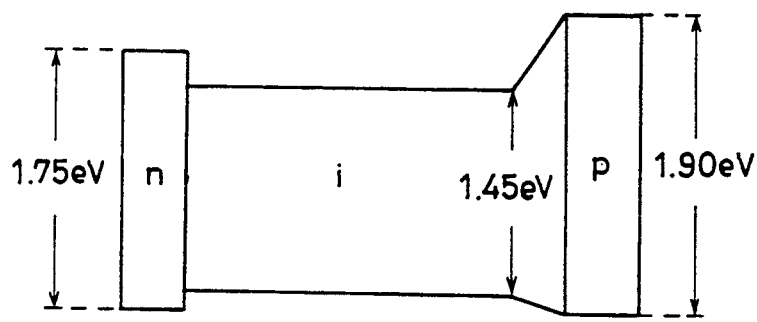
FIGS. 3 and 4 are diagrams of the energy band structures of solar cells according to the prior art.
Figure 13:
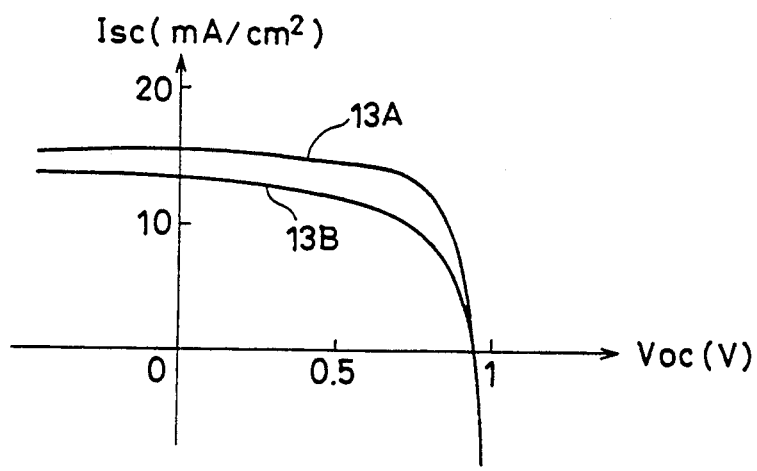
FIG. 13 is a graph showing a comparison of the photoelectric conversion characteristics of the solar cell of the third embodiment and the solar cell according to the prior art.

Referring to FIG. 13, the curve 13A indicates the photoelectric conversion characteristics of a solar cell according to the third embodiment. Also, for comparison, another curve 13B indicates the photoelectric conversion efficiency of the prior art solar cell indicated by curve 2A of FIG. 2. The i layer 3 of the solar cell according to the prior art has a steady bandgap E=1.95eV over the entire thickness. As shown in this graph, in the solar cell of the third embodiment, as compared to the solar cell of the prior art, the open-circuit voltage $V_{oc}$ is equivalent, but the short-circuit current $I_{sc}$ increases by about 10% and also the fill factor FF increases by about 10%, with the result that the photoelectric conversion efficiency is considerably improved.

Figure 14:
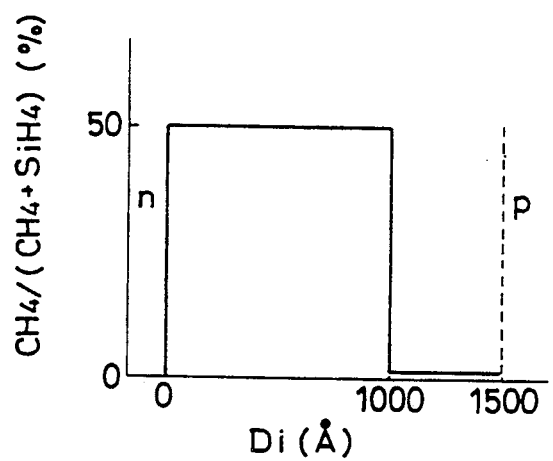
FIG. 14 is a graph showing the relationship between the thickness of the i layer of a solar cell according to the fourth embodiment and the gas flow ratio.
Figure 15:
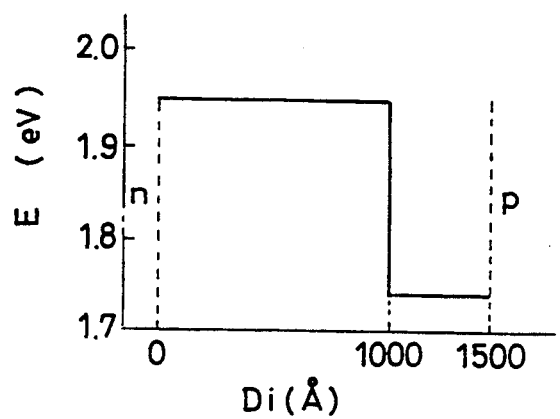
FIG. 15 is a graph showing changes of the bandgap in the thickness direction of the i layer of the solar cell of the fourth embodiment.

FIG. 14 shows the variation of the gas flow ratio $CH_4/(CH_4+SiH_4)$ in depositing the i layer 3a in a solar cell according to the fourth embodiment, and FIG. 15 shows the variation of the bandgap E in the i layer 3a formed with the gas flow ratio changed as shown in FIG. 14. As seen from these figures, by sharply changing the gas flow ratio $CH_4/(CH_4+SiH_4)$, the bandgap E of i layer 3a can be sharply changed. The solar cell according to the fourth embodiment including an i layer 3a having such a change of the bandgap E as shown in FIG. 15 also has improved photoelectric conversion characteristics similarly to that expressed with the curve 13A in FIG. 13.

Figure 16:
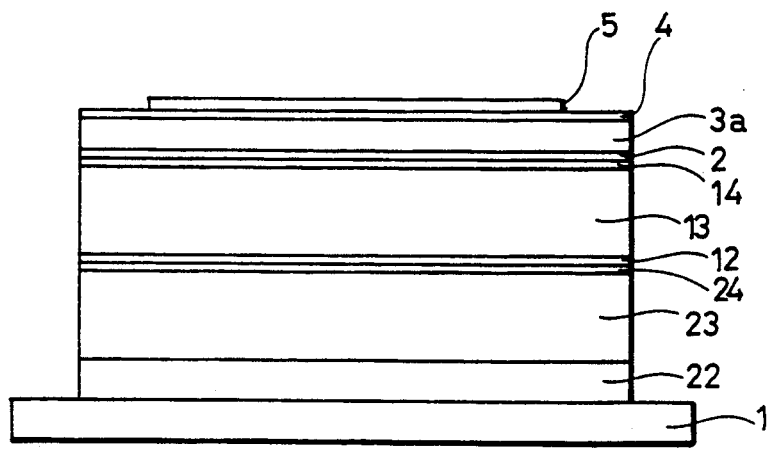
FIG. 16 is a schematic cross sectional view showing the structure of a tandem type solar cell according to the fifth embodiment.

Referring to FIG. 16, a tandem type solar cell according to the fifth embodiment is shown. In the tandem type solar cell, three cells each having an n-i-p junction are stacked. An n layer 22 in a cell at the first level is formed on a conductive substrate 1. The n layer 22 is formed relatively thick with a thickness of about 1000 Å in consideration of unevenness of the surface of substrate 1. I layer 23 in the cell at the first level is formed of a-SiGe having a thickness of about 2500 Å.

The cell at the first level further includes a p layer 24. The cell at the second level includes an i layer 13 of a-Si with a thickness of about 2000 Å and a p layer 14. The cell at the third level is similar to the cell according to the third embodiment or the fourth embodiment, but the thickness of the i layer 3a is about 1000 Å.

Figure 17:
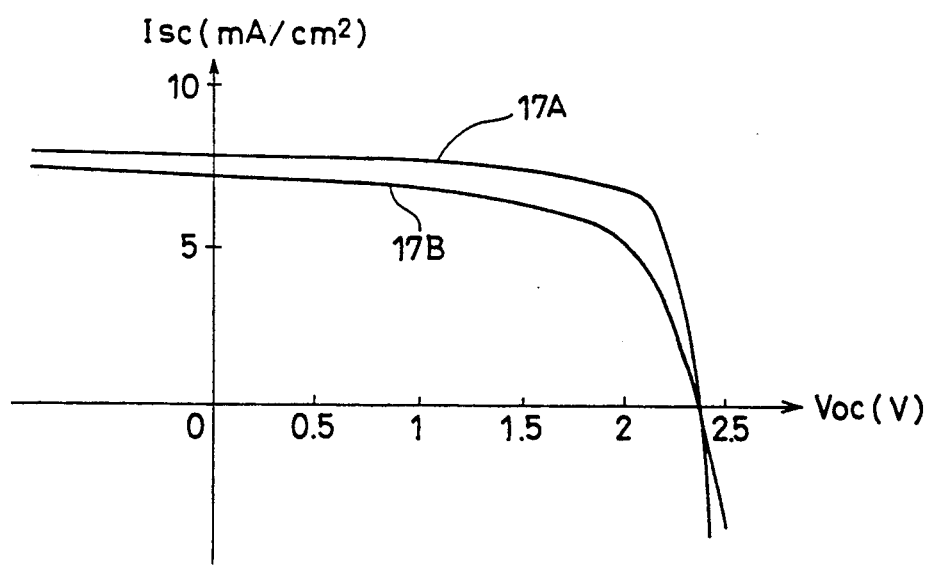
FIG. 17 is a graph for comparing the photoelectric conversion efficiencies of the tandem type solar cell according to the fifth embodiment and a conventional tandem type solar cell.

Referring to FIG. 17, the curve 17A shows the photoelectric conversion characteristics of the tandem type solar cell of FIG. 16. Also, for comparison, the curve 17B shows the photoelectric conversion characteristics of a conventional tandem type solar cell. However, in the conventional tandem type solar cell, the i layer 3a in the cell at the third level of FIG. 16 is replaced by an i layer of a-Si with a thickness of about 300 Å. That is, as shown in FIG. 17, it is seen that the short-circuit current $I_{sc}$ and the fill factor FF are also improved in the tandem type solar cell of the fifth embodiment as compared to a conventional tandem type solar cell to improve the photoelectric conversion efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amorphous semiconductor solar cell, comprising:
   an i type layer formed of an at least partly alloyed, substantially intrinsic amorphous semiconductor;
   an n type amorphous semiconductor layer formed on one side of said i type layer; and
   a p type amorphous semiconductor layer formed on the other side of said i type layer;
   wherein said i type layer includes a first sub layer having a bandgap varied in the thickness direction thereof to have a maximum bandgap larger than the bandgap of said p type layer near its interface with said p type layer.

2. The amorphous semiconductor solar cell according to claim 1, wherein said i type layer further includes a second sub layer having a bandgap minimum between said first sub layer and said n type layer.

3. The amorphous semiconductor solar cell according to claim 2, wherein the bandgap of said i type layer varies continuously.

4. The amorphous semiconductor solar cell according to claim 2, wherein said i type layer includes a portion in which the bandgap varies discontinuously.

5. The amorphous semiconductor solar cell according to claim 2, said i type layer including a sub-layer of a SiGe alloy and a sub-layer of a-SiC alloy.

6. The amorphous semiconductor solar cell according to claim 5, said i type layer further including an a-Si sub-layer.

7. The amorphous semiconductor solar cell according to claim 2, said i type layer including at least a sub-layer of a-SiC alloy.

8. The amorphous semiconductor solar cell according to claim 7, said i type layer further including a sub-layer of a-Si.

9. The amorphous semiconductor solar cell according to claim 1, further comprising:
   additional semiconductor layers provided on at least one side of said n type layer and said p type layer in order to produce a tandem type structure in which a plurality of p-i-n junctions are formed.

* * * * *